United States Patent
Good

(10) Patent No.: US 7,066,107 B2
(45) Date of Patent: Jun. 27, 2006

(54) SHIELDING SYSTEM FOR PLASMA CHAMBER

(75) Inventor: Brian James Good, Eugene, OR (US)

(73) Assignee: Hynix Semiconductor Manufacturing America Inc., Eugene, OR (US)

( * ) Notice: Subject to any disclaimer, the term of this patent is extended or adjusted under 35 U.S.C. 154(b) by 167 days.

(21) Appl. No.: 10/232,956

(22) Filed: Aug. 28, 2002

(65) Prior Publication Data

US 2003/0079834 A1 May 1, 2003

Related U.S. Application Data

(60) Provisional application No. 60/315,868, filed on Aug. 28, 2001.

(51) Int. Cl.
*C23C 16/00* (2006.01)

(52) U.S. Cl. .................. 118/723 R; 156/345.1

(58) Field of Classification Search ............ 118/723 R; 156/916; 250/492.2, 492.3, 492.23; 204/192.12, 204/192.11, 192.1

See application file for complete search history.

(56) References Cited

U.S. PATENT DOCUMENTS

| | | | |
|---|---|---|---|
| 5,518,593 A | 5/1996 | Hosokawa et al. | |
| 5,641,375 A | 6/1997 | Nitescu et al. | |
| 5,763,895 A * | 6/1998 | Tien et al. .............. | 250/492.21 |
| 5,788,799 A | 8/1998 | Steger et al. | |
| 5,803,977 A | 9/1998 | Tepman et al. | |
| 5,824,197 A | 10/1998 | Tanaka | |
| 5,851,343 A | 12/1998 | Hsu et al. | |
| 5,891,350 A * | 4/1999 | Shan et al. .................... | 216/71 |
| 5,895,923 A | 4/1999 | Blake | |
| 5,903,009 A | 5/1999 | Bernstein et al. | |
| 5,909,031 A * | 6/1999 | Kellerman et al. ..... | 250/492.21 |
| 5,951,775 A | 9/1999 | Tepman | |
| 5,964,947 A | 10/1999 | Zhao et al. | |
| 6,051,122 A | 4/2000 | Flanigan | |
| 6,099,651 A | 8/2000 | Sajoto et al. | |
| 6,120,660 A | 9/2000 | Chu et al. | |
| 6,143,086 A | 11/2000 | Tepman | |
| 6,149,784 A | 11/2000 | Su et al. | |
| 6,170,429 B1 | 1/2001 | Schoepp et al. | |
| 6,171,453 B1 | 1/2001 | Chung et al. | |
| 6,234,219 B1 * | 5/2001 | Donohoe ..................... | 141/98 |
| 6,251,216 B1 * | 6/2001 | Okamura et al. ......... | 156/345.1 |
| 6,284,093 B1 | 9/2001 | Ke et al. | |
| 6,403,491 B1 * | 6/2002 | Liu et al. ..................... | 438/710 |
| 6,583,427 B1 * | 6/2003 | Edmonds et al. ...... | 250/492.21 |
| 2003/0038252 A1 | 2/2003 | Danciu et al. | |

* cited by examiner

*Primary Examiner*—Parviz Hassanzadeh
*Assistant Examiner*—Michelle Crowell
(74) *Attorney, Agent, or Firm*—Townsend and Townsend and Crew LLP; Babak Kusha

(57) ABSTRACT

A shield system for use in a plasma chamber, such as a source chamber for an ion implantation machine, including a top shield plate configured to be attached with a top interior surface of the plasma chamber; a bottom shield plate configured to be attached with a bottom interior surface of the plasma chamber; and a rear shield plate configured to be attached with a rear interior surface of the plasma chamber, wherein a rear edge of the top shield plate meets a top edge of the rear shield plate, and wherein a rear edge of the bottom shield plate meets a bottom edge of the rear shield plate, such that the top shield plate, the bottom shield plate and the rear shield plate fit together to substantially cover the chamber's interior surfaces, thus reducing depositions on the inside surfaces of the plasma chamber, while the plasma chamber is operating.

13 Claims, 4 Drawing Sheets

US 7,066,107 B2

SHIELDING SYSTEM FOR PLASMA CHAMBER

CROSS-REFERENCES TO RELATED APPLICATIONS

The present application claims priority to U.S. Provisional Patent Application No. 60/315,868, filed Aug. 28, 2001, the teachings of which are herein incorporated by reference in their entirety for all purposes.

BACKGROUND OF THE INVENTION

The present invention is related to an improved shielding system for a chamber in which plasma is created.

In a typical semiconductor manufacturing operation plasmas are frequently used for many purposes, for example, for etching of layers formed on semiconductor wafers or deposition of materials on semiconductor wafers. Process technologies such as anisotropic plasma etching are well-known, as are processes such as plasma enhanced chemical vapor deposition. In such equipment, the plasma is typically created in the chamber, and then applied to a wafer after exiting through an aperture in the chamber wall. Another typical semiconductor manufacturing operation in which plasma are used is an ion implantation operation. Specifically, plasma is formed in a source chamber of an ion implantation machine.

FIG. 1 is a photograph illustrating the inside of a chamber 100 within which the plasma is formed. The particular equipment depicted in FIG. 1 is a source chamber for an ion implantation tool supplied by Varian. A cover plate has been removed to allow viewing of the chamber for illustrative purposes. Each time a plasma is formed in the chamber, deposits are formed on the interior surfaces of the chamber. These deposits gradually accumulate, necessitating periodic interruption of the use of the equipment for preventive maintenance.

The chamber 100 shown in FIG. 1 has interior surfaces, including a top surface 102, a bottom surface 104, and a beam aperture 106 through which an ion beam exits the chamber 100. As depicted in FIG. 1, the top surface 102 is generally planar and holds a top magnet, which is partially covered by a top magnet cover 108. Likewise, the bottom surface 104 also holds a bottom magnet which is partially covered by a bottom magnet cover 110. Furthermore, the chamber 100 is in fluid communication with a vacuum pump such as, for example, a turbo pump which is used to create and maintain vacuum conditions in the chamber. The turbo pump is partially shielded from the plasma by a flange 112.

In the configuration depicted in FIG. 1, the manufacturer has included two shields 114 and 116 which are illustrated near the rear surface of the chamber. As the machine is operated, the deposits form on these shields, and the shields can be removed for cleaning.

FIG. 2 is a photograph illustrating the side wall 201 of the chamber of FIG. 1. FIG. 2 illustrates a sidewall of the chamber 100, together with numerous corners and curves 202, which are difficult to reach and clean effectively. It is not unusual for technicians to spend hours cleaning material that deposits on these walls between periodic or preventative maintenances.

FIG. 3 is a photograph illustrating the bottom wall 302 (also 104 in FIG. 1) of the chamber of FIG. 1. FIG. 3 illustrates one of the magnets 304 in the bottom surface of the chamber (the circular region) together with the shield 306 (also 110 in FIG. 1) which only partially surrounds the magnet 304. The shield also receives depositions from the plasma formed in the chamber, and also must be cleaned. As can be seen from this figures (FIG. 3), the original manufacturer-supplied source magnet cover 306 does not sufficiently protect the source magnet regions, which receive considerable depositions during normal operation. FIG. 3 also shows flange 308 (also 112 in FIG. 1) which is used to prevent the depositions from the plasma on or near the turbo pump.

FIG. 4 illustrates the area 400 near the source turbo pump (not shown). The source turbo pump is partially protected from depositions from the plasma by the flange 308. When the chamber is cleaned the area surrounding the source turbo pump collects any fluid used to clean the chamber and traps it in places from which it is essentially impossible to manually remove. As a result, the trapped fluids are removed by pumping the chamber down to a vacuum, and waiting for all of the accumulated fluid to evaporate. The combined cleaning and outgassing time for the chamber greatly extends the duration of preventive maintenance. Of course, during all of the period that the equipment is offline, products cannot be produced, creating a less than efficient operation.

There is therefore a need for an improved shielding system that adequately protects the internal surfaces as well as regions near the vacuum pump of a plasma chamber from depositions from the plasma.

BRIEF SUMMARY OF THE INVENTION

The present invention is directed towards a shield system for use in a plasma chamber, including a top shield plate configured to be attached with a top interior surface of the plasma chamber; a bottom shield plate configured to be attached with a bottom interior surface of the plasma chamber; and a rear shield plate configured to be attached with a rear interior surface of the plasma chamber, wherein a rear edge of the top shield plate meets a top edge of the rear shield plate, and wherein a rear edge of the bottom shield plate meets a bottom edge of the rear shield plate, such that the top shield plate, the bottom shield plate and the rear shield plate fit together to substantially cover the chamber's interior surfaces, thus reducing depositions on the inside surfaces of the plasma chamber, while the plasma chamber is operating.

Additionally, in certain aspects the top, or bottom or both the top and bottom shield plates include a substantially flat planar portion and further include structural members configured to fit over members projecting from the interior surface of the plasma chamber, thus enabling the substantially flat planar portion of the shield plate to fit adjacent to the interior surface of the plasma chamber.

Furthermore, the rear shield plate includes an aperture aligned with an aperture of said plasma chamber for the egress of ions from said chamber. In certain embodiments, the top shield plate, the bottom shield plate and the rear shield plate are manufactured from graphite.

In addition to the three shield segments described above, an embodiment of the shield system of the present invention further includes a flange shield having a shape substantially similar to a flange surrounding the plasma chamber vacuum pump, where the flange shield is configured to couple with the flange surrounding the vacuum pump so as to extend the flange and thus reduce depositions near the vacuum pumps in the plasma chamber.

In addition, certain embodiments of the shield system of the present invention include a top extension shield plate, where the top extension shield plate has an edge substantially equal in size to an edge of the top shield plate, the top extension shield plate having a groove along this edge, and where the top shield plate has a tongue along its matching edge, such that the groove of the top extension shield plate is configured to engage the tongue of the top shield plate. Furthermore, in addition to the tongue and groove arrangement, the top extension shield plate is supported by a top extension support member, where the support member is configured to support the top extension shield plate along an edge other than said edge having the groove.

For a further understanding of the nature and advantages of the present invention, reference should be made to the following description in conjunction with the accompanying drawings.

DETAILED DESCRIPTION OF THE INVENTION

Figure 1:
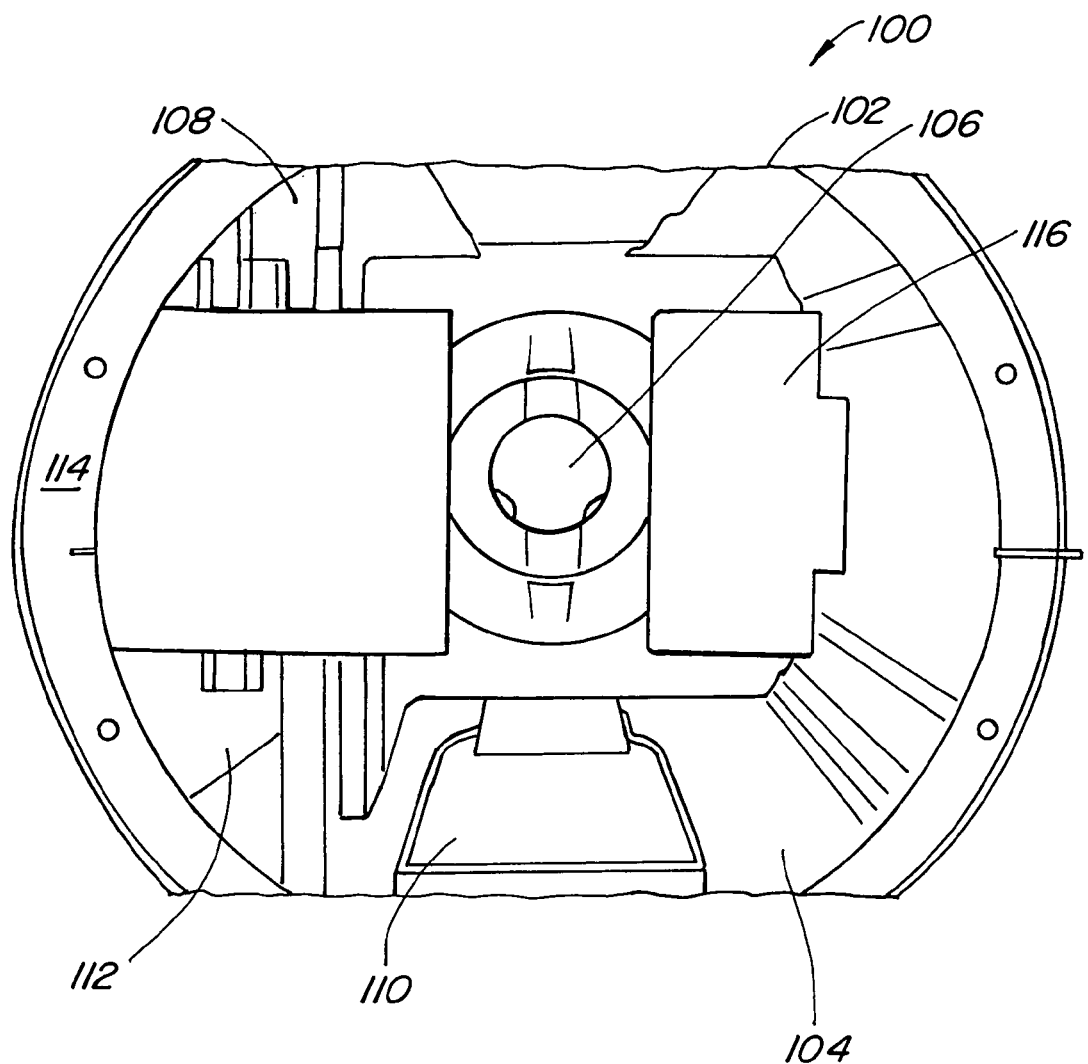
FIG. 1 is a photograph illustrating the inside of a chamber within which a plasma is formed.
Figure 2:
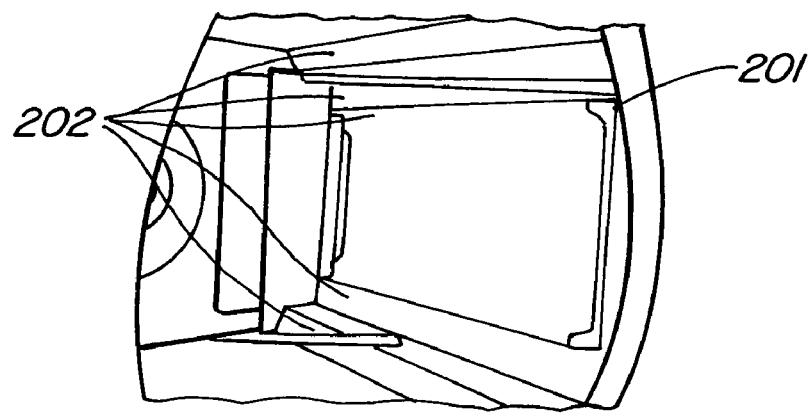
FIG. 2 is a photograph illustrating the side wall of the chamber of FIG. 1.
Figure 5:
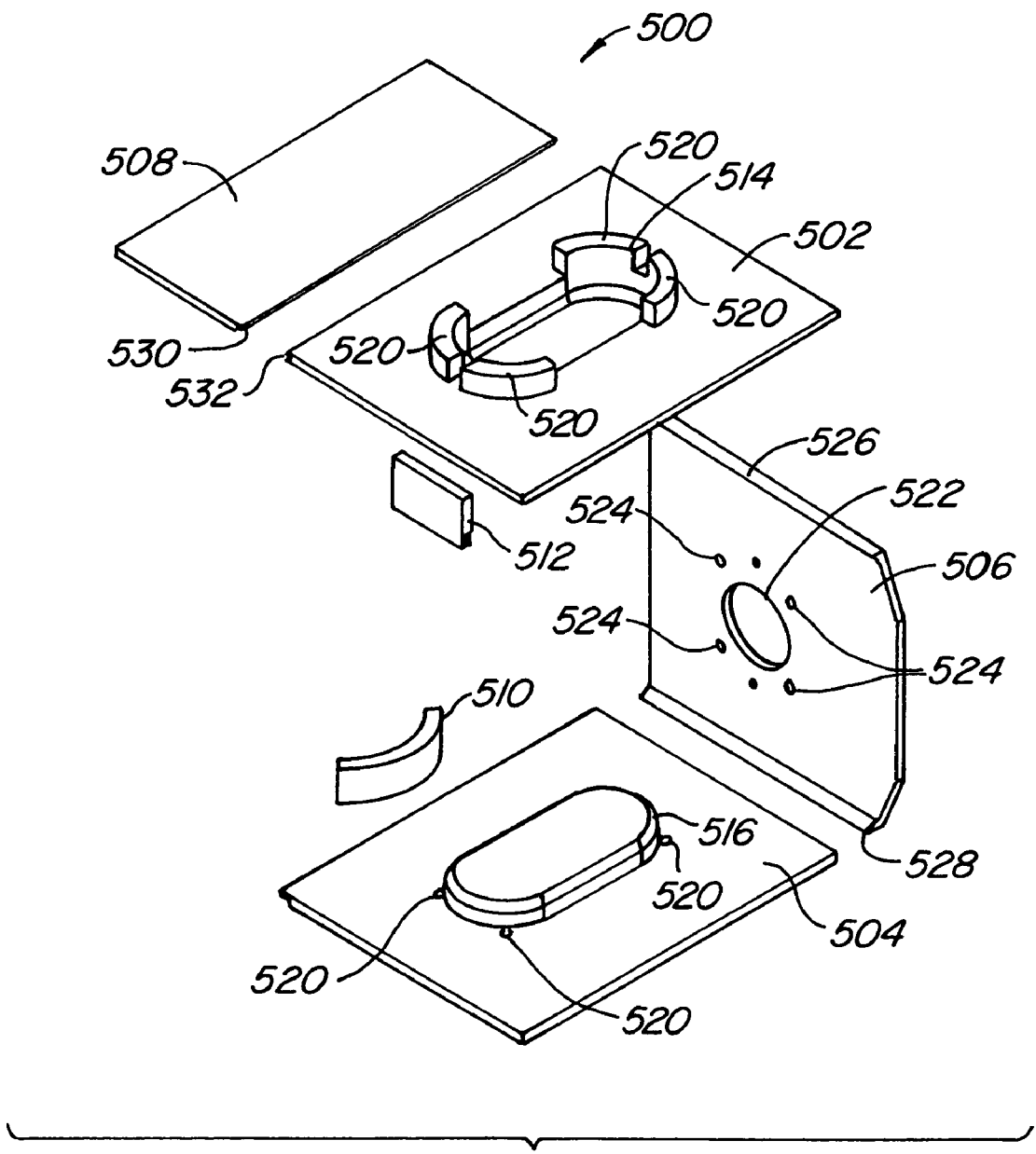
FIG. 5 is a diagram of the shielding components in accordance with one embodiment of the present invention.

Embodiments of the present invention are directed towards a shielding system for a chamber, such as the chamber depicted in FIG. 1, which shielding fits together more easily than prior art shielding, and provides better protection for the chamber. The shielding is illustrated in FIG. 5. It is relatively easy to install, and stable once installed within the chamber. As the plasma chamber is operated, some materials are deposited on the sidewalls just as before. Here, however, because the interior shielding is relatively easy to remove, it is a straightforward matter to remove the interior shielding and replace it with clean shielding reducing the amount of downtime in the chamber.

FIG. 5 illustrates most of the shielding components 500 in the position that it would be if it were to be introduced into the chamber in the orientation depicted. In other words, the top plate 502, bottom plate 504 and back plate 506 would all be aligned as shown. The manner of interconnection between the chamber and the shielding is arbitrary, any well-known technique can be used. In the preferred embodiment it is affixed using conventional fasteners, such as screws, pins, bolts or the like. As shown in FIG. 5, the shielding 500 includes a bottom plate 504, a back plate 506, a top plate 502 and top plate extension 508, together with a flange shield 510 and a top extension support 512. These components together combine to cover essentially all the exposed internal surfaces of the plasma chamber. Thus instead of merely covering portions of the internally exposed surfaces as is done with the manufacturer-supplied shields, the shielding system in accordance with embodiments of the present invention fit together to cover essentially all the internally exposed surfaces of the plasma chamber.

Figure 3:
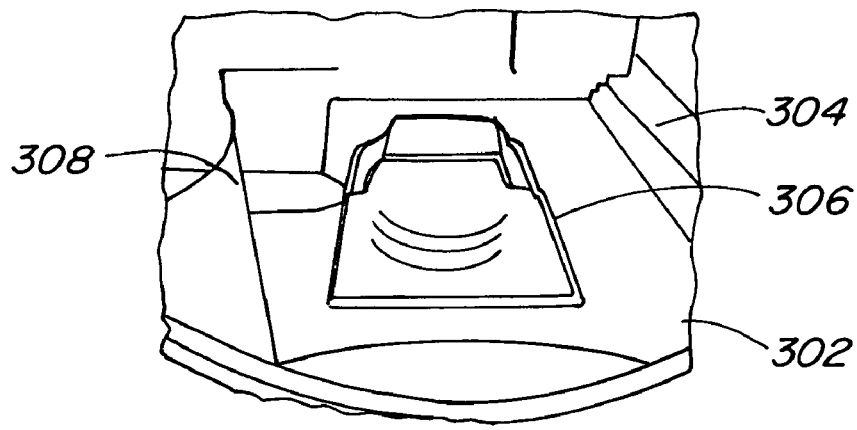
FIG. 3 is a photograph illustrating the bottom wall of the chamber of FIG. 1.
Figure 4:
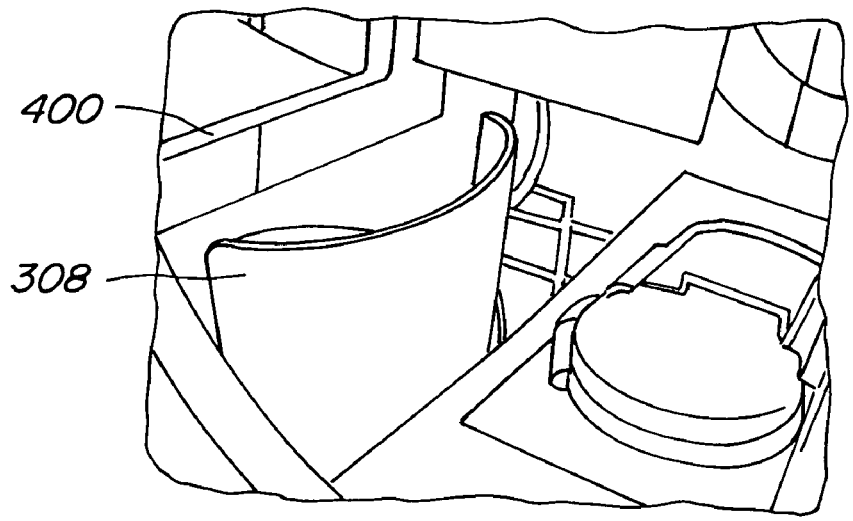
FIG. 4 is a photograph illustrating the region near the source turbo pump for the chamber of FIG. 1.

As can be seen from this figure (FIG. 5), the top plate 502 and the bottom plate 504 are substantially similar to one another in that they both have structures for fitting over projections (e.g., source magnets in a source chamber) from the top and the bottom surfaces of the plasma chamber. For example, as is shown on the top plate 502, projections 514 extending upwards from the top of the top plate 502 fit over and cover the top source magnet 304 (shown in FIG. 3). The back side of the projected structure from the top plate 502 can be seen as projection 516 seen on the bottom plate 504. The structures 514 and 516 projecting from the top plate 502 and 504 may take any shape and preferably have a shape that matches and is able to fit over the protrusions extending from the top and bottom surfaces of the chamber which is being covered by the top and bottom plates. In the shield embodiment shown in FIG. 5, the structures 514 and 516 are generally oval-shaped to match the shape of the magnets that they cover. So, in operation the top plate 502 and the bottom plate 504 fit over structures that project away from the chamber's internal surfaces, such as the top and bottom source magnets. Both the top plate 502 and the bottom plate 504 are connected with the top and bottom surfaces of the chamber using conventional fasteners that fit through holes 520 in the top plate 502 and the bottom plate 504.

Back plate 506 is also configured to fit over the back of the chamber. As can be seen from FIG. 5, the back plate 506 has an aperture 522 through which the plasma or ion beam exits the chamber. Furthermore, the back plate 506 is connected with the back of the chamber using conventional fasteners that fit through holes 524 in the back plate 506. The back plate 506 includes a top edge 526 and a bottom edge 528 that butt up against the top plate 502 and bottom plate 504 respectively to ensure that the underlying chamber surfaces are sufficiently covered once the shield system is in place.

Figure 6:
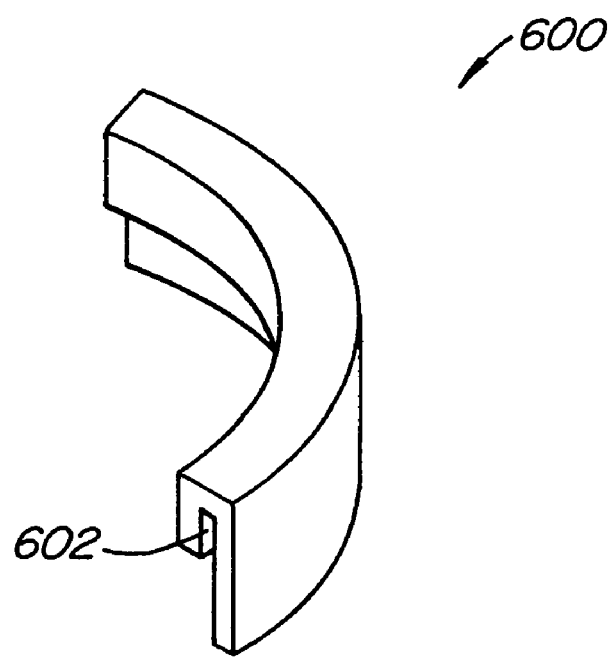
FIG. 6 is a more detailed diagram of the flange shield component in accordance with one embodiment of the present invention.

In addition to the top plate 502, bottom plate 504 and back plate 506, the shield system further includes a top extension 508 which is supported by the top extension support 512. Additionally, the shield system includes a flange shield 510. FIG. 6 is a more detailed diagram of the flange shield 600 (510 in FIG. 5). The flange shield 600 in accordance with embodiments of the present invention is designed for the flange surrounding the vacuum pump. Groove 602 in flange shield 600 fits over the flange 112 (shown in FIG. 1) to improve the shielding and hence decrease depositions from the plasma in the area near the vacuum pump. The increased and improved shielding of this region will minimize or even eliminate the need for wet cleaning in this area. Consequently, since no liquids are used for wet cleaning and hence no liquids are trapped during cleaning, the time required for outgassing following periodic maintenance is also significantly improved.

Figures 7, 7A:
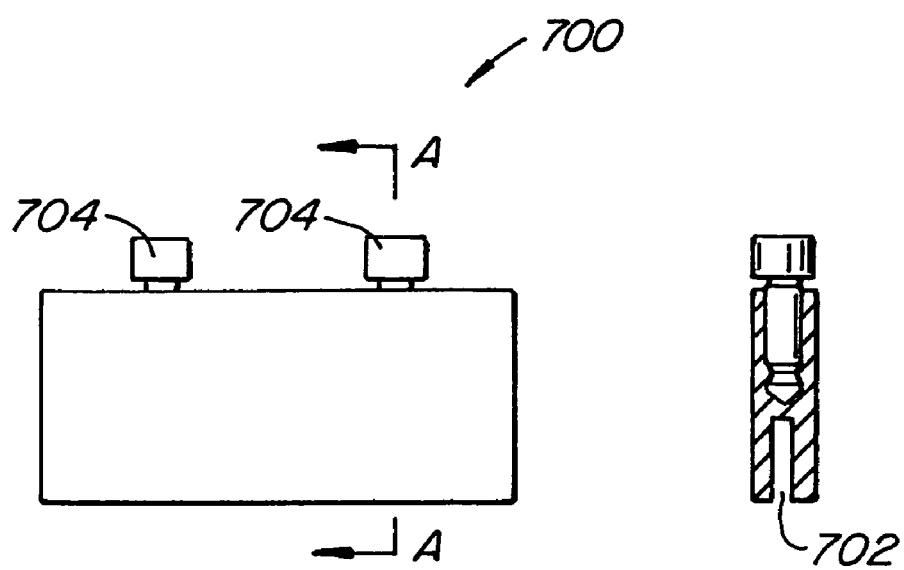
FIG. 7 is a more detailed diagram of the top extension shield support component in accordance with one embodiment of the present invention.
FIG. 7A is a diagram of section A—A of FIG. 7.

FIG. 7 is a more detailed diagram of the top extension shield support component 700 in accordance with one embodiment of the present invention. FIG. 7A shows section A—A of FIG. 7. As is shown in FIG. 7A, a groove 702 in the top extension shield support component 700 fits over the manufacturer supplied shield 114. Bolts 704 mate with and extend from the support 700 to ensure that the top extension 508 which rests on top of the support 700 is supported in a stable manner inside the chamber.

In addition to the top extension support 512, the top extension plate 508 has tongue 530 on one edge that mates with a groove 532 on an edge of the top shield 502 to ensure that the top extension shield is held in place inside the chamber in a stable manner.

The shields described are preferably manufactured from graphite, but may also be made from stainless steel, aluminum, or other materials.

The shield system described and the supporting pieces are configured to fit together in a stable manner inside the chamber to substantially shield the internal surfaces of the chamber including surfaces that are high deposition areas (such as areas near the magnets in a source chamber) from depositions from the plasma. The shield system in accordance with embodiments of the present invention increase the available operating time of chambers to which they are fitted, thereby rendering more efficient the production of integrated circuits which are fabricated using such chambers. Specifically, the availability of spare shields enables quick exchanges of the shields so that the shields can be exchanged and cleaned quickly as the need arises. This swapping and easy cleaning reduces the cleaning time for chambers such as, for example, source chambers by several hours, thus rendering the overall manufacturing process much more efficient. Furthermore, the use of the shield system in accordance with embodiments of the present invention, and thus the elimination of the use of wet cleaning of the chamber, also reduces the time needed for outgassing. This reduction in the time needed for outgassing further reduces the time needed for vacuum recovery by several hours, thus also rendering the overall manufacturing process much more efficient. Additionally the combination of the increased coverage shields and the resulting elimination of wet cleaning reduce the time required for preventive maintenance by several hours (e.g., more than six hours), which significantly improves the availability of the system in which the shielding system is installed.

As will be understood by those skilled in the art, the present invention may be embodied in other specific forms without departing from the essential characteristics thereof. For example, the top, bottom or rear shields may have surface projections of any shape to accommodate and fit over projections, such as magnets, from the internal surfaces of the chamber over which they fit. Also, the shields may be fabricated from many suitable materials, such as graphite, aluminum, other metals, or composite material using any combination of suitable manufacturing processes. These other embodiments are intended to be included within the scope of the present invention, which is set forth in the following claims.

What is claimed is:

1. A shield system for use in a plasma chamber, comprising:
    a top shield plate configured to be attached with a top interior surface of the plasma chamber;
    a bottom shield plate configured to be attached with a bottom interior surface of the plasma chamber;
    a rear shield plate configured to be attached with a rear interior surface of the plasma chamber,
    wherein a rear edge of said top shield plate meets a top edge of said rear shield plate, and wherein a rear edge of said bottom shield plate meets a bottom edge of said rear shield plate, such that said top shield plate, said bottom shield plate and said rear shield plate fit together to substantially cover the chamber's interior surfaces, thus reducing depositions on the inside surfaces of the plasma chamber, while the plasma chamber is operating; and
    a top extension shield plate, said top extension shield plate having an edge substantially equal in size to an edge of said top shield plate, said top extension shield plate having a groove along said edge of said top extension shield plate,
    said top shield plate further comprising a tongue along said edge of said top shield plate,
    wherein said groove of said top extension shield plate is configured to engage said tongue of said top shield plate.

2. The shielding system of claim 1 wherein the plasma chamber comprises a source chamber for an ion implantation tool.

3. The shielding system of claim 1 wherein said top shield plate is substantially rectangular shaped.

4. The shielding system of claim 1 wherein said top shield plate comprises a substantially flat planar portion and further comprises structural members configured to fit over members projecting from the top interior surface of the plasma chamber, thus enabling said substantially flat planar portion of said top shield plate to fit adjacent to said top interior surface of the plasma chamber.

5. The shielding system of claim 1 wherein said bottom shield plate comprises a substantially flat planar portion and further comprises structural members configured to fit over members projecting from the bottom interior surface of the plasma chamber, thus enabling said substantially flat planar portion of said bottom shield plate to fit adjacent to said bottom interior surface of the plasma chamber.

6. The shielding system of claim 1 wherein said rear shield plate comprises an aperture aligned with an aperture of said plasma chamber for the egress of ions from said chamber.

7. The shielding system of claim 1 wherein said top shield plate, said bottom shield plate and said rear shield plate are configured for attachment with the chamber's interior surface using fasteners.

8. The shielding system of claim 1 wherein said top shield plate, said bottom shield plate and said rear shield plate are manufactured from graphite.

9. The shielding system of claim 1 further comprising a flange shield having a shape substantially similar to a flange surrounding the plasma chamber vacuum pump, said flange shield configured to couple with the flange so as to extend the flange and thus reduce depositions near the vacuum pumps in the plasma chamber.

10. The shielding system of claim 1 further comprising a top extension support member, said support member configured to support said top extension shield plate along an edge other than said edge having said groove.

11. A shield system for use in a source chamber of an ion implantation tool, comprising:
    a top shield plate configured to be attached with a top interior surface of the source chamber;
    a bottom shield plate configured to be attached with a bottom interior surface of the source chamber; and
    a rear shield plate configured to be attached with a rear interior surface of the source chamber,
    wherein a rear edge of said top shield plate meets a top edge of said rear shield plate, and wherein a rear edge of said bottom shield plate meets a bottom edge of said rear shield plate, such that said top shield plate, said bottom shield plate and said rear shield plate fit together to substantially cover the chamber's interior surfaces, thus reducing depositions on the inside surfaces of the source chamber, while the source chamber is operating, and wherein said top shield plate comprises a substantially flat planar portion and further comprises structural members configured to fit over members projecting from the top interior surface of the plasma chamber, thus enabling said substantially flat planar portion of said top shield plate to fit adjacent to said top interior surface of the source chamber.

12. A shield system for use in a source chamber of an ion implantation tool, comprising:
    a top shield plate configured to be attached with a top interior surface of the source chamber;
    a bottom shield plate configured to be attached with a bottom interior surface of the source chamber; and
    a rear shield plate configured to be attached with a rear interior surface of the source chamber,
    wherein a rear edge of said top shield plate meets a top edge of said rear shield plate, and wherein a rear edge of said bottom shield plate meets a bottom edge of said rear shield plate, such that said top shield plate, said bottom shield plate and said rear shield plate fit together to substantially cover the chamber's interior surfaces, thus reducing depositions on the inside surfaces of the source chamber, while the source chamber is operating,
    wherein said top shield plate comprises a substantially flat planar portion and further comprises structural members configured to fit over members projecting from the top interior surface of the plasma chamber, thus enabling said substantially flat planar portion of said top shield plate to fit adjacent to said top interior surface of the source chamber, and
    wherein said rear shield plate comprises an aperture aligned with an aperture of said source chamber for the egress of ions from said chamber.

13. A shield system for use in a source chamber of an ion implantation tool, comprising:
    a top shield plate configured to be attached with a top interior surface of the source chamber;
    a bottom shield plate configured to be attached with a bottom interior surface of the source chamber;
    a rear shield plate configured to be attached with a rear interior surface of the source chamber,
    wherein a rear edge of said top shield plate meets a top edge of said rear shield plate, and wherein a rear edge of said bottom shield plate meets a bottom edge of said rear shield plate, such that said top shield plate, said bottom shield plate and said rear shield plate fit together to substantially cover the chamber's interior surfaces, thus reducing depositions on the inside surfaces of the source chamber, while the source chamber is operating,
    wherein said top shield plate comprises a substantially flat planar portion and further comprises structural members configured to fit over members projecting from the top interior surface of the plasma chamber, thus enabling said substantially flat planar portion of said top shield plate to fit adjacent to said top interior surface of the source chamber,
    wherein said rear shield plate comprises an aperture aligned with an aperture of said source chamber for the egress of ions from said chamber;
    a flange shield having a shape substantially similar to a flange surrounding the source chamber vacuum pump, said flange shield configured to couple with the flange so as to extend the flange and thus reduce depositions near the vacuum pumps in the source chamber; and
    a top extension shield plate, said top extension shield plate having an edge substantially equal in size to an edge of said top shield plate, said top extension shield plate having a groove along said edge of said top extension shield plate,
    said top shield plate further comprising a tongue along said edge of said top shield plate,
    wherein said groove of said top extension shield plate is configured to engage said tongue of said top shield plate.

* * * * *